United States Patent
Oh et al.

(10) Patent No.: US 7,181,186 B2
(45) Date of Patent: Feb. 20, 2007

(54) MIXER AND FREQUENCY CONVERSION APPARATUS FOR IMPROVING PHASE-MISMATCHING

(75) Inventors: Seung Min Oh, Chunlabook-do (KR); Hyo Seok Kwon, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 477 days.

(21) Appl. No.: 10/462,609

(22) Filed: Jun. 17, 2003

(65) Prior Publication Data
US 2004/0132423 A1 Jul. 8, 2004

(30) Foreign Application Priority Data
Jan. 3, 2003 (KR) .................. 10-2003-0000248

(51) Int. Cl.
*H04B 1/26* (2006.01)
(52) U.S. Cl. .................. 455/323; 455/131; 455/189.1; 375/269
(58) Field of Classification Search ........ 455/302–305, 455/313–314, 323, 326, 131, 189.1; 375/269, 375/272–275, 279–281
See application file for complete search history.

(56) References Cited

U.S. PATENT DOCUMENTS

| | | | |
|---|---|---|---|
| 4,985,683 A * | 1/1991 | O'Neill ................. | 328/133 |
| 5,140,198 A | 8/1992 | Atherly et al. ............. | 307/529 |
| 5,452,290 A * | 9/1995 | Mihm, Jr. ................. | 370/436 |
| 5,548,619 A * | 8/1996 | Horiike et al. ............. | 375/344 |
| 5,633,898 A * | 5/1997 | Kishigami et al. .......... | 375/344 |
| 6,321,076 B1 | 11/2001 | Jianqin | |
| 2003/0117200 A1 * | 6/2003 | Koh et al. ................. | 327/238 |
| 2004/0209591 A1 * | 10/2004 | Martin et al. ............. | 455/333 |

* cited by examiner

*Primary Examiner*—Quochien B. Vuong
*Assistant Examiner*—Tuan H. Nguyen
(74) *Attorney, Agent, or Firm*—Lowe Hauptman & Berner, LLP.

(57) ABSTRACT

A frequency conversion apparatus having a mixer eliminates phase miss-matching between two intermediate frequency (IF) signals having the same frequency and a 90 degree difference in phase. The frequency conversion apparatus for compensating for phase mismatching of first and second IF signal in response to an RF input signal transmitted through an RF input terminal includes a quadrature signal generator (QSG) outputting first and second oscillating frequency signals having a 90 degree difference in phase, a first mixer mixing the RF input signal with a first resultant frequency signal having a first resultant phase and generated from the first oscillating frequency signal and an inverted signal of the second oscillating frequency signal, and a second mixer mixing the RF signal with a second resultant frequency signal having a second resultant phase and generated from the second oscillating frequency signal and an inverted signal of the first second oscillating frequency signal. The frequency conversion apparatus having a mixer improving a signal-to-noise (SN) ratio and increasing an image-rejection ratio by correcting phase miss-matching.

16 Claims, 17 Drawing Sheets

A:(100M 359.131)   delta:(0 −250.377)
B:(100M 108.754)   slope: undefined

A:(1.1G 17.803)   delta:(0-110.01)
B:(1.1G -92.207)  slope:undefined

MIXER AND FREQUENCY CONVERSION APPARATUS FOR IMPROVING PHASE-MISMATCHING

CROSS-REFERENCE TO RELATED APPLICATION

This application claims to benefit of Korean Patent Application No. 2003-000248, filed Jan. 3, 2003, in the Korean Intellectual Property Office, the disclosure of which is incorporated herein by reference.

BACKGROUND OF THE INVENTION

1. Field of the Invention

The present invention relates to a frequency conversion apparatus having an improved mixer, and more particularly, to a frequency conversion apparatus having an improved mixer compensating for phase miss-matching of two intermediate frequency (IF) signals having a 90 degree phase difference, improving a signal-to-noise ratio (SNR), and increasing an image-rejection ratio.

2. Description of the Related Art

Generally, a receiving structure, such as a zero-IF structure or an image-rejection structure requires an in-phase (I) signal and a quadrature-phase (Q) signal according to characteristics of the receiving structure. Miss-matching in phase occurs in the I and Q signals due to various factors and lowers a signal-to-noise ratio, thereby reducing receiving sensitivity of the receiving structure.

FIG. 1 is a block diagram of a conventional frequency conversion apparatus used in the zero-IF structure or the image rejection structure. Referring to FIG. 1, the frequency conversion apparatus includes a local oscillator 11 generating an oscillating frequency LO signal, a phase shifter 12 shifting a phase of the oscillating frequency signal LO by 90 degrees to generate a first oscillating frequency (LO) signal LOI, an I-mixer 13 mixing the first LO signal LOI with an RF impact signal RFIN to generate a first intermediate frequency signal (IIF), a Q-mixer 14 mixing a second oscillating frequency (LO) signal LOQ with the RF input signal RFIN to generate a second intermediate frequency signal QIF, and filters 15, 16 low-pass filtering the first IF signal IIF of the I-mixer 13 and the second IF signal QIF of the Q-mixer 14, respectively.

The mixers 13, 14 of the conventional frequency conversion apparatus receive the first LO signal LOI and the second LO signal LOQ having a 90 degree phase difference with the first LO signal LOI from the local oscillator 11 and output the first and second IF signals IIF and QIF by mixing the RF input signal with the first and second LO signals LOI and LOQ, respectively, and the first and second IF signals IIF and QIF should be different in phase by 90 degrees.

FIGS. 2A and 2B are block diagrams of the I-mixer 13 and the Q-mixer 14, respectively. Referring to FIGS. 2A and 2B, the I-mixer 13 includes a first RF amplifier the RF input signal RFIN and converting voltage to current, a first switching unit 13b on-off switching an output of the first RF amplifier 13a according to the LO signal (LOI or LOQ), and a first load unit 13c converting an output of the first switching unit 13b into a voltage signal (IIF). The Q mixer 14 includes a second RF amplifier 14a amplifying the RF input signal RFIN and converting voltage current, a second switching unit 14b on-off switching an output of the second RF amplifier 14a according to the LO signal (LOI or LOQ), and a second load unit 14c converting an output of the second switching unit 14b into a voltage signal (QIF).

However, the first LO signal LOI and the second LO signal LOQ cannot form a 90 degree difference in phase if components associated with local oscillator 11 lose symmetry in phase. As a result, the first IF signal IIF and the second IF signal QIF cannot form the 90 degree difference in phase. That is, a miss-matching error between the first LO signal LOI and the second LO signal LOQ causes another miss-matching error between the first IF signal IIF and the second IF signal QIF.

FIG. 3 is a block diagram of another conventional frequency conversion apparatus. Referring to FIG. 3, the frequency conversion apparatus includes a quadrature signal generator QSG 31 outputting two oscillating frequency (LO) signals having the same frequency and a 90 degree phase difference, mixers 33, 34 mixing an RF input signal with the LO signals of the QSG 31, filters 35, 36 coupled to the corresponding mixers 33, 34 and a phase detector 37 providing phase control signals C1, C2 to the filters 35, 36 and the QSG 31 to eliminate a miss-matching error between the LO signals.

The frequency convention apparatus shown in FIG. 3 uses a phase miss-matching eliminating method of detecting a phase difference corresponding to the phase miss-matching error between the first and second IF signals IF1, IF2 and providing the phase difference to the filters 35, 36 and the QSG 35 to eliminate the miss-matching error of the first and second IF signals IF1, IF2.

However, this conventional frequency conversion apparatus cannot be used in the image-rejection receiving structure since the image-rejection ratio is determined according to the phase miss-matching between the first and second IF signals IF1, IF2 or the LO signals (LOI, LOQ) in the image-rejection receiving structure, and a structure and a size of the image-rejection receiving structure become bulky due to complexity of the image-rejection receiving structure implemented with the conventional frequency conversion apparatus.

SUMMARY OF THE INVENTION

In order to solve above and/or other problems, it is an aspect of the invention to provide frequency conversion apparatus having a mixer eliminating phase miss-matching between two intermediate frequency (IF) signals having the same frequency and a 90 degree difference in phase.

It is an other aspect of the invention to provide a frequency conversion apparatus having a mixer improving a signal-to-noise (SN) ratio and increasing an image-rejection ratio by correcting phase miss-matching.

Additional objects and advantageous of the invention will be set forth in part in the description which follows and, in part, will be obvious from the description, or may be learned by practice of the invention.

To achieve the above and other objects, a mixer mixes an RF input signal transmitted through an input terminal with an oscillating frequency signal, and includes a first switching unit switching on/off the RF input signal according to a first oscillating frequency signal, and a second switching unit coupled to the input terminal parallel to the first switching unit and switching on/off the RF input signal according to an inverted signal of a second oscillating signal.

According to another aspect of the present invention, a frequency conversion apparatus for compensating for phase mismatching of first and second IF signal in response to an RF input signal transmitted through an RF input terminal includes a quadrature signal generator (QSG) outputting first and second oscillating frequency signals having a 90 degre difference in phase, a first mixer mixing the RF input signal with a first resultant frequency signal having a first resultant phase and generated from the first oscillating frequency signal and an inverted signal of the second oscillating frequency signal, and a second mixer mixing the RF signal with a second resultant frequency signal having a second resultant phase and generated from the second oscillating frequency signal and an inverted signal of the first second oscillating frequency signal.

BRIEF DESCRIPTION OF THE DRAWINGS

These and other advantages of the invention will become apparent and more readily appreciated from the following description of the preferred embodiments, taken in conjunction with the accompanying drawings of which.

DETAILED DESCRIPTION OF THE PREFERRED EMBODIMENTS

Figure 1:
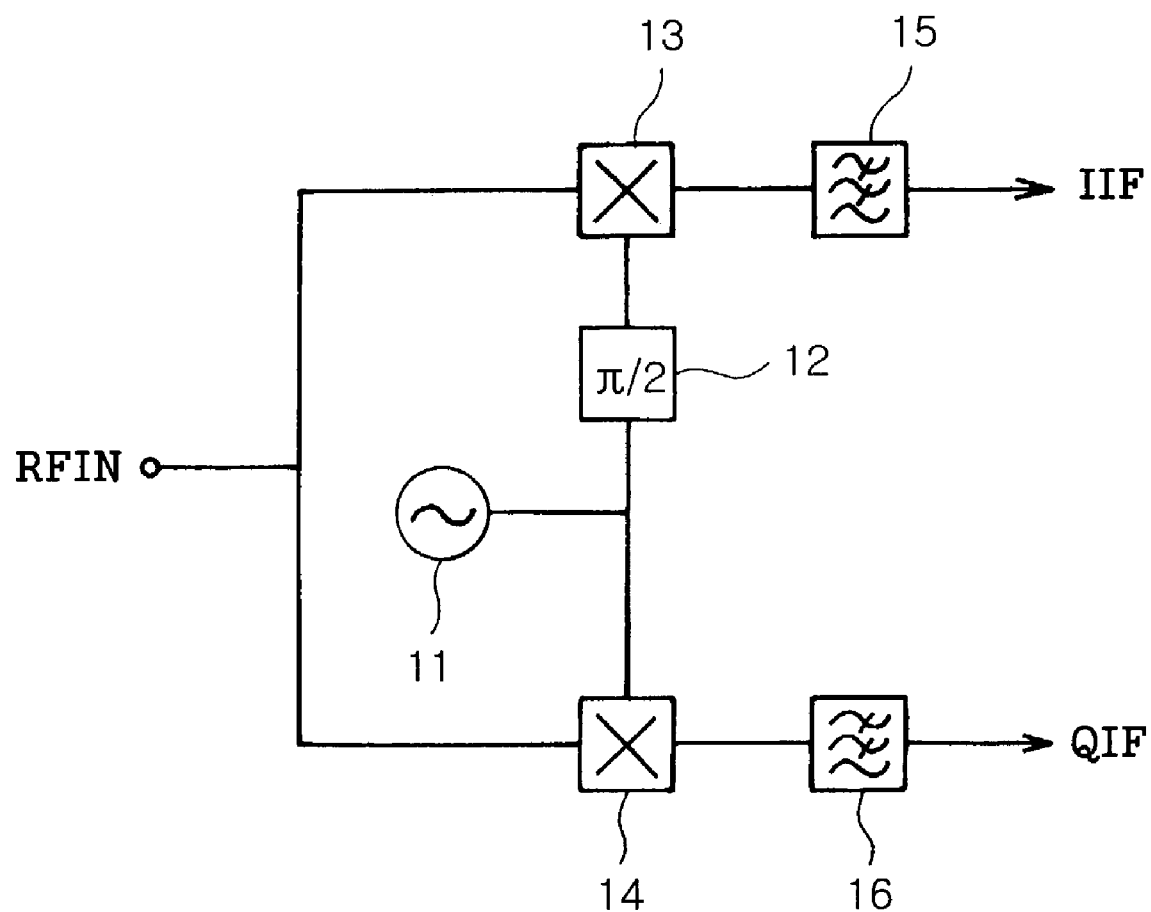
FIG. 1 is a block diagram of a conventional frequency conversion apparatus.
Figure 2A:
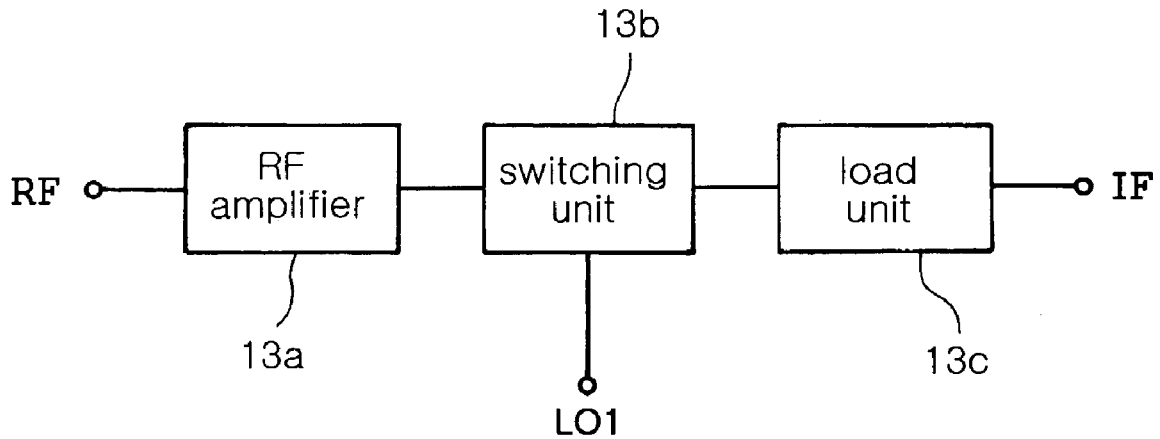
FIGS. 2A and 2B are block diagrams of first and second mixer of the apparatus shown in FIG. 1, respectively.
Figure 2B:
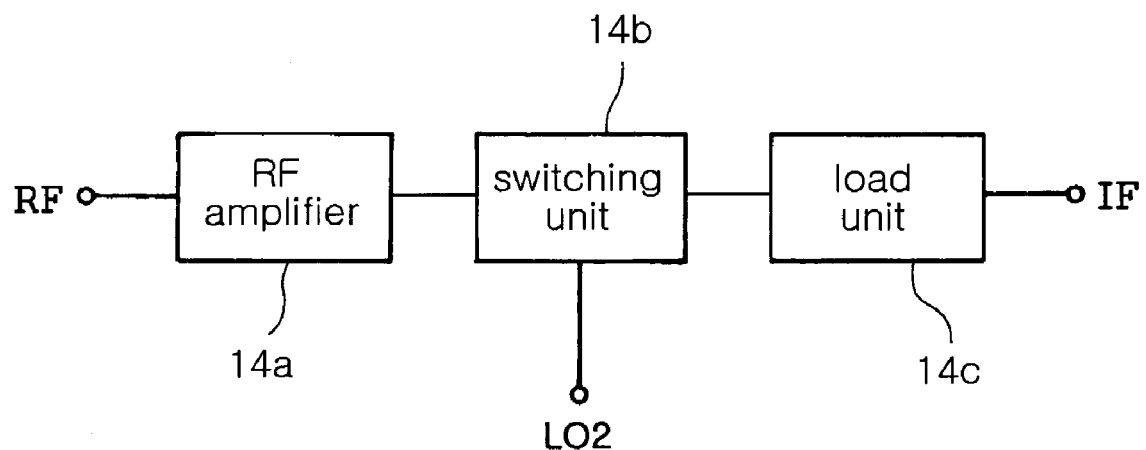
Figure 3:
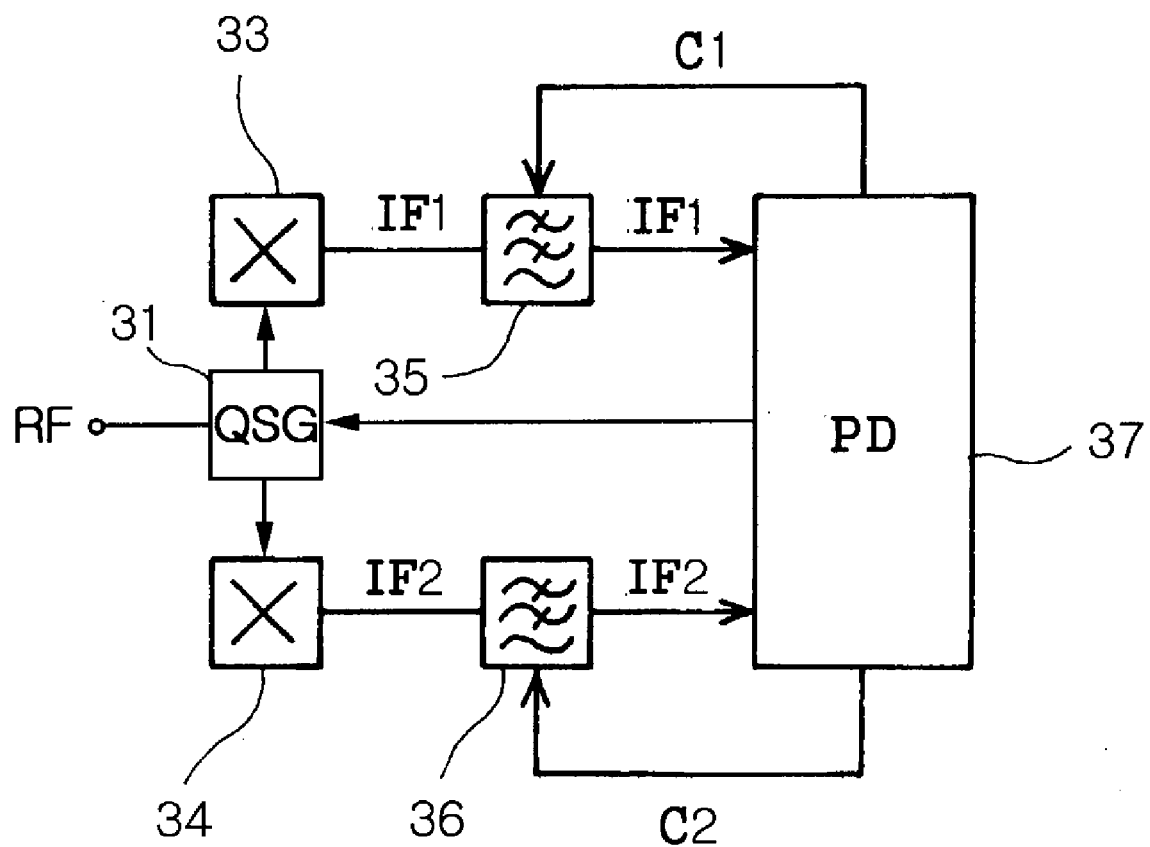
FIG. 3 is a block diagram of another conventional frequency conversion apparatus.

Reference will now be made in detail to the present preferred embodiments of the present invention, examples of which are illustrated in the accompanying drawings, wherein like reference numerals refer to the like elements throughout. The embodiments are described below in order to explain the present invention by reference to the figures.

Figure 4:
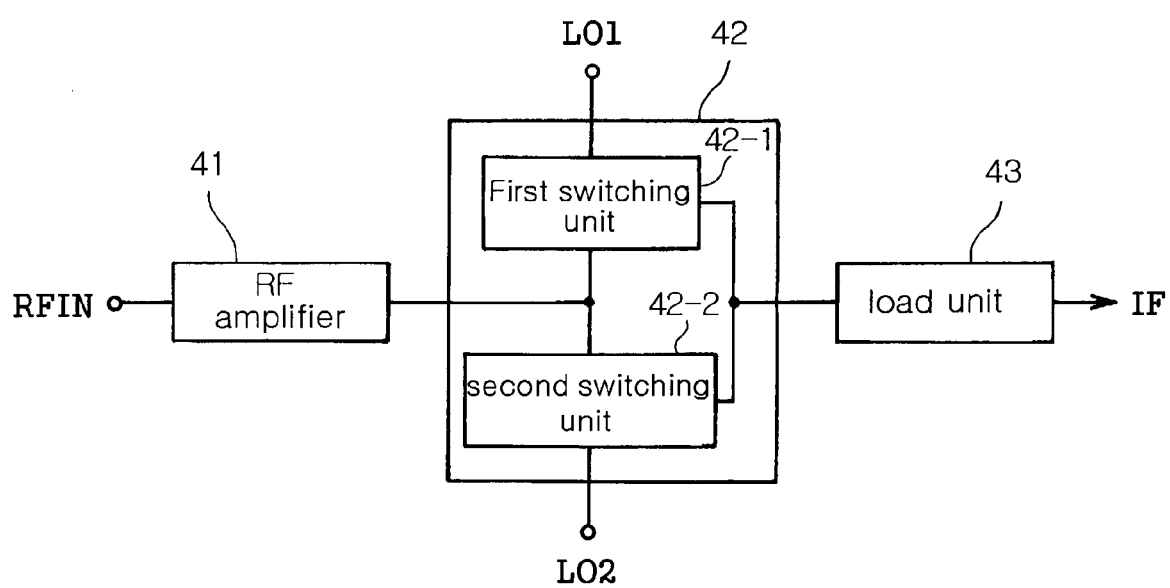
FIG. 4 is a block diagram of a mixer according to an embodiment of the present invention.

A structure and an apparatus of a frequency conversion apparatus having an improved mixer correcting phase missmatching are described here in after in conjunction with the accompanying drawings according to an embodiment of the present invention FIG. 4 is a block diagram of the frequency conversion apparatus according to the present invention. Referring to FIG. 4, the mixer includes an RF amplifier 41 amplifying an RF input signal RFIN transmitted through an input terminal unit, a switching unit 42 switching on-off an output of the RF amplifier 41 according to a resultant frequency signal LO having a resultant phase from a first local oscillating frequency (LO) signal LO1 and a second local oscillating frequency (LO) signal LO2, and a load unit 43 converting an output signal of the switching unit 42 using an I/V converting process.

The switching unit 42 includes a first sub-switching unit 42-1 switching on/off the RF input signal RFIIN according to the first LO signal LO1, and a second sub-switching unit 42-2 coupled to the RF amplifier 41 parallel to the first switching unit 42-1 and switching on/off the RF input signal RFTh4 according to the second LO signal L02. The first and second sub-switching unit 42-1, 42-2 will be described in detail hereinafter.

Figure 5:
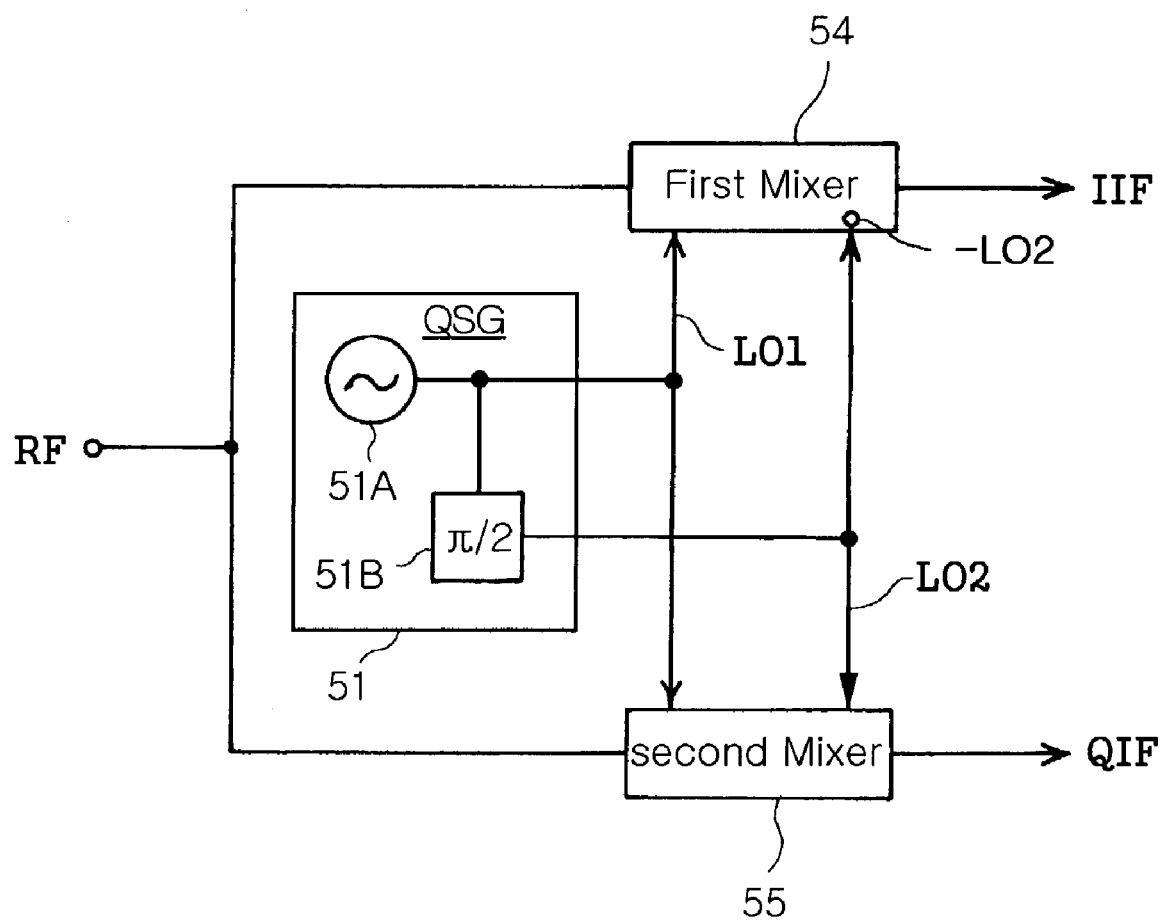
FIG. 5 is a block diagram of a frequency conversion apparatus using the mixer shown in FIG. 4.

FIG. 5 is a block diagram of the frequency conversion apparatus using the mixer shown in FIG. 4 according to the present invention. Referring to FIG. 5 the frequency conversion apparatus includes a quadrature signal generator (QSG) 51 outputting the first LO signal LO 1 and the second LO signal L02 both having a 90 degree phase difference, a first mixer 54 outputting a first intermediate frequency (IF) signal IF1 by mixing the RF input signal with a first resultant frequency signal LO1' having a resultant phase and generated from the first LO signal LO1 of the QSG 51 and a generated frequency signal inverted from the second LO signal LO2, a second mixer 55 outputting a second intermediate frequency (IF) signal IF2 by mixing the RF input signal with a second resultant frequency signal LO2' having a resultant phase and generated from the second LO signal LO2 of the QSG 51 and the first LO signal LO1.

The QSG 51 includes an local oscillator 51A outputting the first LO signal LO1, and a phase shifter 51B outputting the second LO signal LO2 by shifting the first LO signal LO1 by 90 degrees in phase.

Figure 6A:
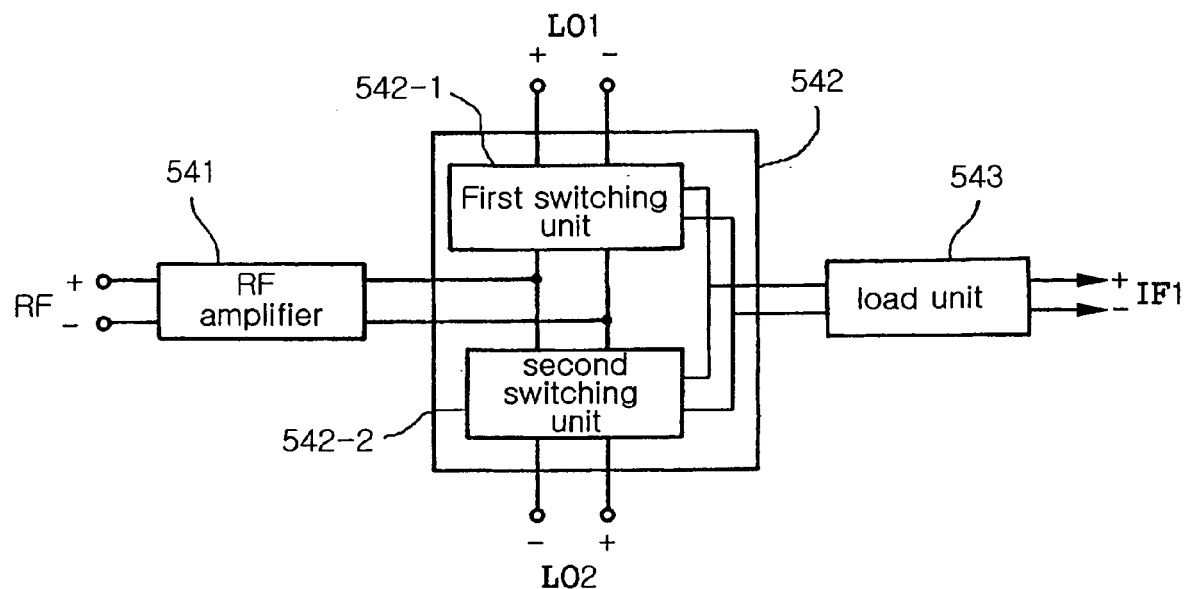
FIGS. 6A and 6B are block diagrams showing a first mixer and a second mixer of the frequency conversion apparatus shown in FIG. 5, respectively.
Figure 6B:
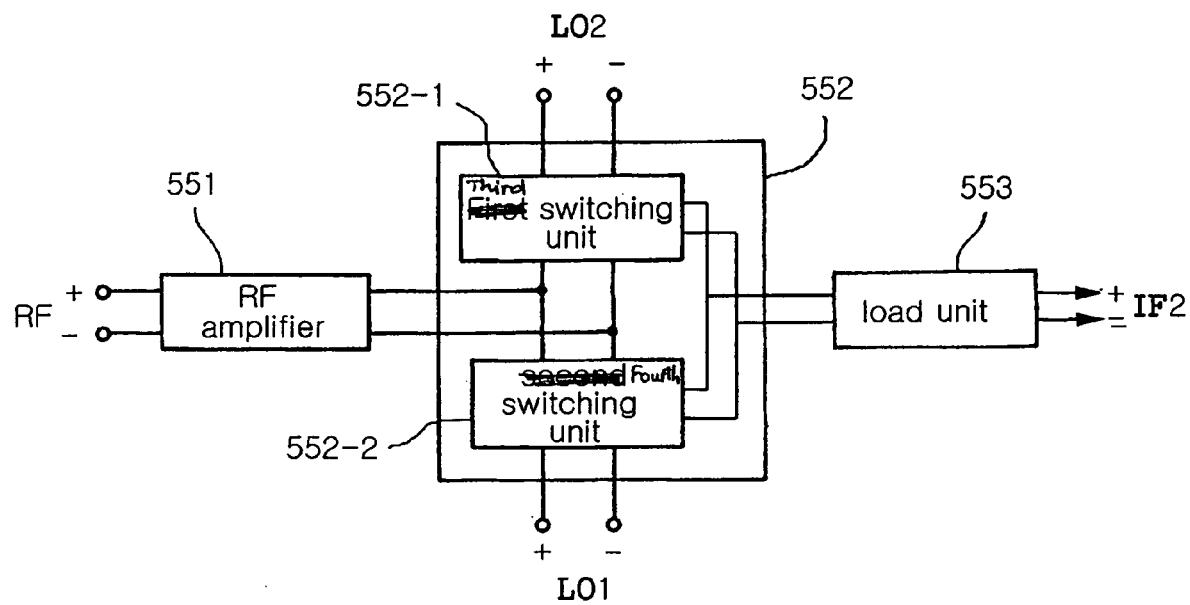

FIGS. 6A and 6B are block diagrams showing the first mixer 54 and the second mixer 55. Referring FIG. 6, the mixer 54 includes a first RF amplifier 541 amplifying the RF input signal RFIN transmitted through the input terminal unit, a first switching unit 542 switching on/off the RF input signal RFIN amplified by the first RF amplifier 541 according to the first resultant frequency signal having the resultant phase of the first LO signal LO1 of the QSG 51 and the inverted frequency signal inverted from the second LO signal LO2, a first load unit 543 outputting a first I/V converted signal from an output of the first switching unit 542

The first switching unit 542 of the first mixer 54 includes a first sub-switching unit 542-1 switching on/off the RF input signal RFTh4 according to the first LO signal LO1, and a second sub-switching unit switching on/off the RF input signal REIN according to the generated frequency signal inverted from the second LO signal LO2 and coupled parallel to the first sub-switching unit 542-1. Referring to FIG. 6B, the second mixer 55 includes a second RF amplifier 551 amplifying the RE input signal RFTN transmitted through the input terminal unit, a second switching unit 552 switching on/off the RE input signal REIN amplified by the second RE amplifier 551 according to the second resultant frequency signal having the resultant phase of the second LO signal LO2 of the QSG 51 and the generated frequency signal inverted from the first LO signal LO1, a second load unit 553 outputting a second I/V converted signal from an output of the second switching unit 552.

The second switching unit 552 of the second mixer 55 includes a third sub-switching unit 552-1 switching on/off the RE input signal REIN according to the second LO signal LO2, and a fourth sub-switching unit 552-2 switching on/off the RE input signal REIN according to the generated frequency signal inverted from the first LO signal LO1 and coupled parallel to the third sub-switching unit 552-1.

Figures 7A, 7B:
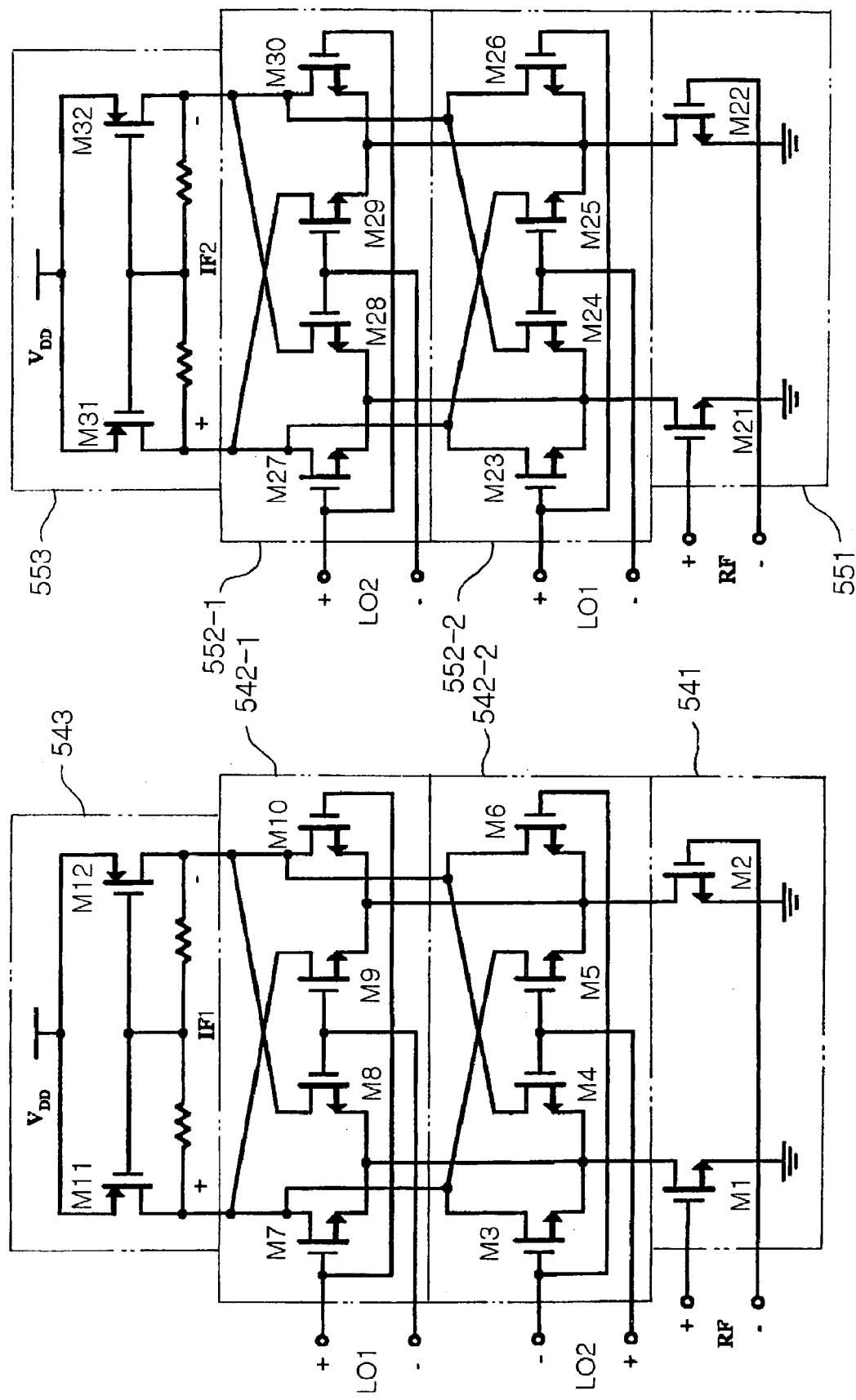
FIGS. 7A and 7B are circuit diagrams of the first mixer and the second mixer shown in FIGS. 6A and 6B respectively.

In FIG. 7A the first RF amplifier 541 includes the MOS transistors M1 and M2 each having a source; a drain, and a gate. The sources of M1 and M2 are grounded. The drain of M1 is coupled to the sources of M3, M4, M7, and M8, and the drain of M2 is coupled the sources of M5, M6, M9, and M10. The gates of M1 and M2 are coupled to a positive RF signal terminal of the input terminal unit and a negative RF signal terminal of the input terminal unit, respectively.

In FIG. 7A, the first load unit 543 includes the MOS transistors M11, M12 and two resistors (R1 and R2). Sources of the M11 and M12 are coupled to a power source, and gates of M11 and M12 are coupled to each other. A Drain of M11 is coupled to the drains of M3, M5, M7, and M9. The resistor (R1) is coupled between the drain of M11 and the gates of M11 and M12. The drain of M12 is coupled to the drain of M2, M6, M8, and M10. The resistor (R2) is coupled between the drain of M12 and the gates of M11 and M12.

FIGS. 7A and 7B are circuit diagrams of the first mixer 54 and the second mixer 55 shown in FIGS. 6A and 6B, respectively. Referring FIG. 7A, the first sub-switching unit 542-1 includes MOS transistors M7, M8, M9, and M10 each having a source, a drain, and a gate. The source of M7 is coupled to the source of M8, the source of M9 is coupled to the source of M10. The drain of M7 is coupled to the drain of M9, the drain of M8 is coupled to the drain of M10, and the gates of M8 and M10 are coupled while the gated of M8 and M9 are coupled.

In FIG. 7A, the second sub-switching unit 542-2 includes the MOS transistors M3, M4, M5, and M6 each having a source, a drain, and a gate. The sources of M3 and M4 are coupled to each other, and the sources of M5 and M6 are coupled to each other. The drains of M3 and M5 are coupled to each other, and the drains of M4 and M6 are coupled to each other. The gates of M3 and M6 are coupled to each other, and the gates of M4 and M5 are coupled to each other.

Referring to FIG. 7B, the third-sub switching unit 552-1 includes the MOS transistors M27, M28, M29, M30 and having a source, a drain, and a gate. The source of M27 is coupled to the source of M28, and the source of M29 is coupled to the source of M30. The drains of M27 and M29 are coupled to each other, and the drains of M28 and M30 are coupled to each other. The gates of M27 and M30 are coupled to each other while the gates of M28 and M29 are coupled to each other.

In FIG. 7B, the fourth sub-switching unit 552-2 includes the MOS transistors M23, M24, M25, and M26 each having a source, a drain, and a gate. The source of M23 is coupled to the source of M24, and the source of M25 is coupled to the source of M26. The drains of M23 and M25 are coupled, and the drains of M24 and M26 are coupled. The gates of M23 and M26 are coupled to each other while the gates of M24 and M25 are coupled to each other.

In FIG. 7B, the second amplifier 551 includes the MOS transistors M21 and M22 each having a source, a drain, and a gate. The sources of M21 and M22 are grounded. The drain of M21 is coupled to the sources of M23, M24, M27, and M28, and the drain of M22 is coupled to the sources of M25, M26, M29, and M30. The gates of M21 and M22 are coupled to the positive RE signal terminal of the input terminal unit are the negative RE signal terminal of the input terminal unit, respectively.

In FIG. 7B, the second load unit 553 includes the MOS transistors M31, M32, and another two resistors (R3 and R4). Gates of M31 and M32 are coupled to each other, and sources of M31 and M32 are coupled to the power source. A drain of M31 is coupled to M23, M25, M27, and M29. The resistor (R3) is coupled between the drain of M32 and the gates of M31 and M32. The drain of M32 is coupled to the drains of M24, M26, M28, and M30. The resistor (R4) is coupled between the drain of M32 and the gates of M31 and M32.

Referring FIGS. 7A and 7B, a positive (+) terminal of the first LO signal LO1 is coupled to the gates of M7, M10, M23, and M26, and a negative (−) terminal of the first LO signal LO1 is coupled to the gates of M8, M9, M24, and M25 to transmit the generated frequency signal inverted from the first LO signal LO1. A positive terminal of the second LO signal LO2 is coupled to the gates of M4, M5, M27, and M30, and a negative terminal of the second LO signal LO2 is coupled to the gates of M3, M6, M28, and M29 to transmit the generated frequency signal inverted from the second LO signal LO2.

Figure 8:
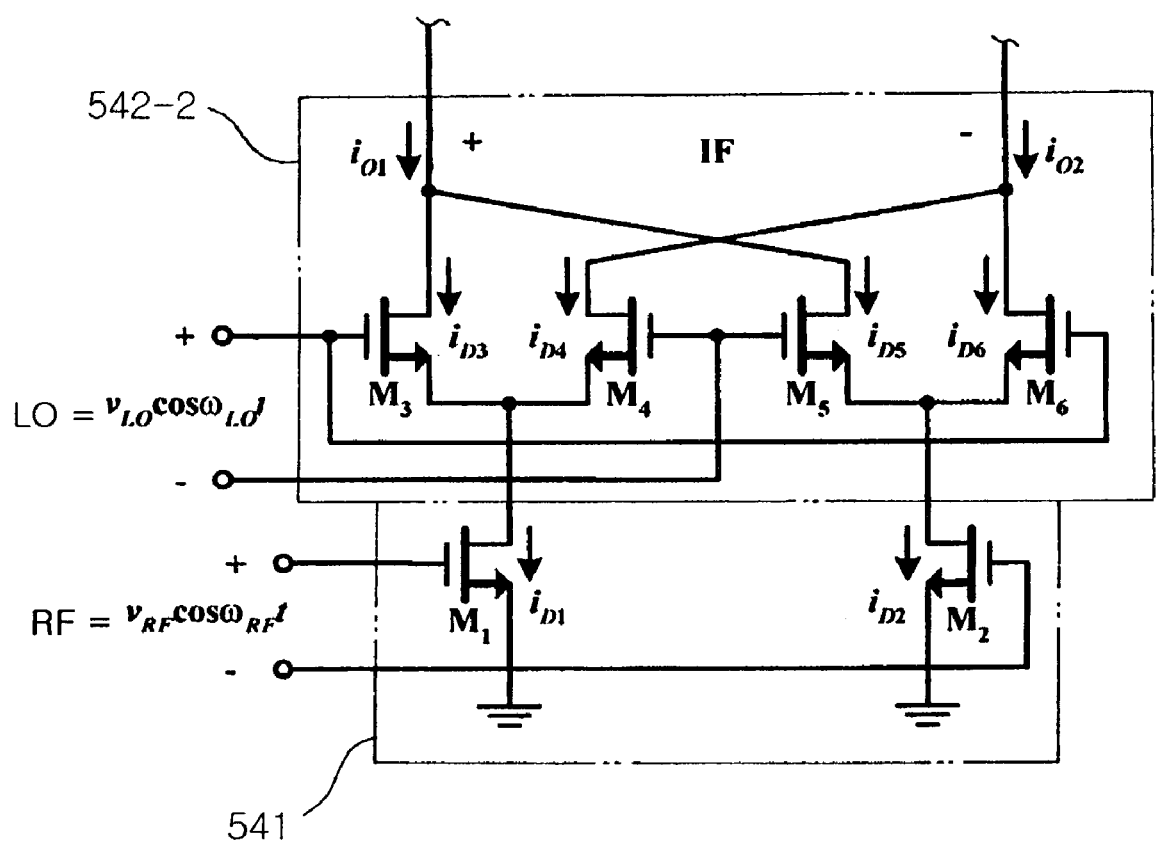
FIG. 8 is a view showing an operation of a portion of the circuit diagram shown in FIG. 7A.
Figure 9A:
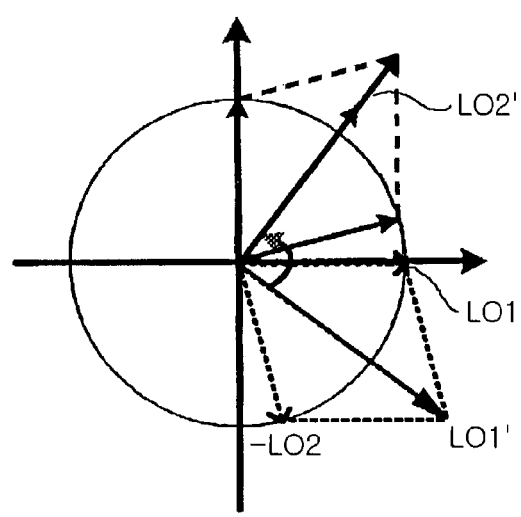
FIGS. 9A and 9B are views showing phase characteristics, first and second LO signals and first and second resultant signals generated in the frequency conversion apparatus shown in FIG. 5.
Figure 9B:
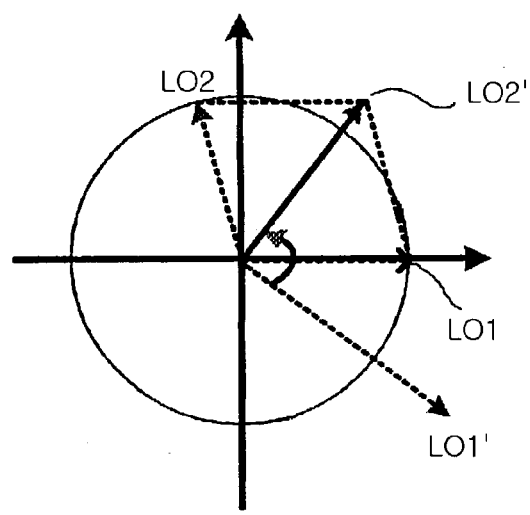

FIG. 8 is a view showing an operation of a portion of the circuit diagram of the first mixer 54 (e.g., double balanced mixer) shown in FIG. 7A. FIGS. 9A and 9B are views showing phase characteristics, first and second LO signals, and the first and second resultant signals generated from the frequency conversion apparatus shown in FIG. 5. FIGS. 10A to 11D are views showing oscillating signals and IF signals generated in a conventional frequency conversion apparatus. FIGS. 11A to 11D are views showing oscillating signals and IF signals generated in the frequency conversion apparatus shown in FIG. 5 according to the present invention.

An operation of the frequency conversion apparatus having the above structure according to the present invention will be described in detail in conjunction with FIGS. 4 to 11D here in after.

First, the mixer shown in FIG. 4 is explained. The RF amplifier 41 amplifies the RF input signal transmitted through the input signal terminal using a predetermined gain as well as performs a voltage-to-current (V/I) conversion. The switching unit 42 switches on/off on output of the RF amplifier 41 according to the resultant frequency signal LO having the resultant phase of the first and second LO signals LO1 and LO2. The load unit 43 provides a predetermined load R to an output of the switching unit 42 as well as performs a current-to-voltage (I/V) conversion on the output of the switching unit 42.

The first switching unit 42-1 of the switching unit 42 switches on/off the RF input signal according to the first LO signal LO1 and the generated frequency signal of the second LO signal LO2, and the second switching unit 42-2 is coupled in parallel to the first switching unit 42-1 and switches on/off the RF input signal according to the inverted frequency signal generated from the second LO signal LO2. The first and second switching units 42-1 and 42-2 will be described in detail later.

As described above, the resultant frequency signal is generated the two LO signals. Using the resultant frequency signal the two LO signals having the 90 degree phase difference are generated more accurately. This will be also described in detail later.

In the frequency conversion apparatus shown in FIG. 5 the QSG 51 outputs the first and second LO signals LO1 and LO2 having the 90 degree phase difference. The first mixer 54 outputs the first IF signal IF1 by mixing the RF input signal with the first resultant frequency signal LO1' having the resultant phase of the first LO signal LO1 and the inverted frequency signal of the second LO signal LO2, and the second mixer 55 outputs the second IF signal IF2 by mixing the RF input signal with the second resultant frequency signal LO2' having the resultant phase of the second LO signal LO2 and the inverted frequency signal of the first LO signal LO1.

For example, the first LO signal LO1 and the second LO signal LO2 correspond to tan LOI signal and an LOQ signal, respectively. In this case, the first mixer 54 and the second mixer 55 correspond to an I mixer processing an I signal and an Q mixer processing a Q signal, respectively.

The local oscillating unit 51A of the QSG 51 outputs the first LO signal LO1, and the phase shifter 51B of the QSG 51 shifts the phase of the first LO signal LO1 by 90 degrees to generate the second LO signal LO2.

Referring to FIGS. 6A and 6B describing the first mixer 54, the first RF amplifier 541 of the first mixer 54 amplifies the RF input signal.

The first switching unit 542 of the first mixer 54 switches on/off the RF input signal amplified by the first amplifier 541 according to the first resultant frequency signal LO1' having the resultant phase of the first LO signal LO1 of the QSG 51 and the inverted frequency signal of the second LO signal LO2. The first load unit 543 of the first mixer 54 outputs the first IF signal IF1 by performing the I/V conversion. The first resultant frequency signal LO1' corresponds to one of an I resultant frequency signal and a Q resultant frequency signal. In this embodiment, the first resultant frequency signal LOI' corresponds to the I resultant frequency signal as an example.

The first sub-switching unit 542-1 of the first switching unit 542 switches on/off the RF input signal according to the first LO signal LO1 of the QSG 51, and the second sub-switching unit 542-2 of the first switching unit 542 switches on/off the RF input signal according to the inverted frequency signal of the second LO signal LO2 of the QSG 51.

Since the first sub-switching unit 542-1 and the second sub-switching unit 542-2 are coupled in parallel, the first resultant frequency signal LO1' of the first LO signal LO1 and the inverted frequency signal of the second LO signal LO2 is generated by the first sub-switching unit 542-1 and the second sub-switching unit 542-2 as shown in FIG. 9A.

Referring to FIG. 6B describing the second mixer 55, the second RF amplifier 551 amplifies the RF input signal. The second switching unit 552 of the second mixer 55 switching on/off the RF input signal amplified by the second RF amplifier 551 according to the second resultant frequency signal having the phase difference of the second LO signal LO2 and the inverted frequency signal of the first LO signal LO1. The second load unit 553 of the second mixer 55 outputs the second IF signal IF2 by performing the I/V conversion. The second resultant frequency signal LO2' may correspond to one of the I resultant frequency signal and the Q resultant frequency signal. In this embodiment, the second resultant frequency signal LO2' corresponds to the Q resultant frequency signal as an example.

The third sub-switching unit 552-1 of the second switching unit 552 switches on/off the RF input signal according to the second LO signal LO2, and the fourth sub-switching unit 552-2 of the second switching unit 552 is coupled to the second RF amplifier parallel to the third sub-switching unit 552-1 and switches on/off the RF input signal according to the inverted frequency signal of the first LO signal LO1 of the QSG 51.

Since the third sub-switching unit 522-1 and the fourth sub-switching unit 552-2 are coupled in parallel, the second resultant frequency signal LO2' is generated from the first LO signal LO1 and the second LO signal LO2 as shown in FIG. 9B Referring to FIGS. 9A and 9B, the first LO signal LO1 and the inverted frequency signal—LO2 of the second LO signal LO2 form the first resultant frequency signal LO1', and the second LO signal LO2 and the first LO signal LO1 form the second resultant frequency signal LO2'. The first and second resultant frequency signals LO1' and LO2' have a phase difference of 90 degrees.

Referring to FIGS. 9A and 9B, the first LO signal LO1 and the inverted frequency signal—LO2 of the second LO signal LO2 forms the first resultant frequency signal LO1', and the second LO signal LO2 and the inverted frequency signal signal—LO1 of the first LO signal LO1 forms the second resultant frequency signal LO2'. The first and second resultant frequency signals LO1' and LO2' form 90 degree in phase.

Two added signals (the first LO signal LO1 and the second LO signal LO2) operate as a single signal having an operational characteristic of a general frequency conversion apparatus. When an amplitude miss-matching occurs in the added signals, such as the first resultant frequency signal or the second resultant frequency signal, the amplitude miss-matching does not cause problems since the LO signal LO having a predetermined size (amplitude) according to the operational characteristic of the general frequency conversion apparatus is applied to the switching unit 54 or 55.

However, when an additional switching unit is added to an existing switching unit in the apparatus, since the phase miss-matching and an amplitude error are associated with an amplitude of current of the additional switching unit, an amount and the amplitude of the current of the additional switching unit is to be determined so as not to affect the amplitude miss-matching in the apparatus.

An operation of the first and second resultant frequency signal of the first and second LO signals according to the structure of the mixer according to the present invention is explained in conjunction with FIGS. 7A 7B, and 8.

Referring to FIG. 8, when the mixer is a double balanced mixer, current $i_{D1}$ and $i_{D2}$ flowing through the RF amplifier 541 can be expressed by the following formula 1, and current $i_{D3}$ through $i_{D6}$ flowing through the switching unit 542-2 can be expressed by the following formula 2. In the following formula 1, $i_D$ represents a direct current.

$$i_{D1} = I_D + \frac{gm \cdot V_{RF}}{2} \cos w_{RF} t \qquad \text{FORMULA 1}$$

$$i_{D2} = I_D + \frac{gm \cdot V_{RF}}{2} \cos(w_{RF} t + \pi) =$$

$$= I_D - \frac{gm \cdot V_{RF}}{2} \cos w_{RF} t$$

$$i_{D3} = i_{D6} = \frac{1}{2} + \frac{2}{\pi} \cos w_{LO} t + \cdots \qquad \text{FORMULA 2}$$

$$i_{D4} = i_{D5} = \frac{1}{2} + \frac{2}{\pi} \cos(w_{LO} t + \pi) + \cdots$$

$$= \frac{1}{2} - \frac{2}{\pi} \cos w_{LO} t + \cdots$$

In the load unit 543, output current io1, io2 and $i_{OUT}$ can be expressed by the following formulas 3, 4, 5.

$$i_{O1} = i_{D1}i_{D3} + i_{D2}i_{D5} \quad \text{FORMULA 3}$$

$$= I_C + \frac{1}{\pi}2gmv_{RF}\cos w_{RF}t \cdot \cos w_{LO}t + \cdots$$

$$= I_C + \frac{1}{\pi}gmv_{RF}\cos(w_{RF} - w_{LO})t +$$

$$\frac{1}{\pi}gmv_{RF}\cos(w_{RF} + w_{LO})t + \cdots$$

$$i_{O2} = i_{D1}i_{D4} + i_{D2}i_{D6} \quad \text{FORMULA 4}$$

$$= I_C - \frac{1}{\pi}2gmv_{RF}\cos w_{RF}t \cdot \cos w_{LO}t + \cdots$$

$$= I_C - \frac{1}{\pi}gmv_{RF}\cos(w_{RF} - w_{LO})t -$$

$$\frac{1}{\pi}gmv_{RF}\cos(w_{RF} + w_{LO})t + \cdots$$

$$i_{OUT} = i_{O1} - i_{O2} = \frac{4}{\pi}gmv_{RF}\cos w_{RF}t \cdot \cos w_{LO}t \quad \text{FORMULA 5}$$

$$= \frac{2}{\pi}gmv_{RF}\cos(w_{RF} - w_{LO})t +$$

$$\frac{2}{\pi}gmv_{RF}\cos(w_{RF} + w_{LO})t + \cdots$$

In the above formulas, when input signals, e.g., first and second signals having the 90 degree phase difference, are input, it is desirable that output signals have the same 90 degree phase difference. This is described in the following formula 6.

$$i_{OUT1} = \frac{4}{\pi}gmv_{RF}\cos w_{RF}t \cdot \cos w_{LO}t \quad \text{FORMULA 6}$$

$$= \frac{2}{\pi}gmv_{RF}\cos(w_{RF} - w_{LO})t$$

$$i_{OUT2} = \frac{4}{\pi}gmv_{RF}\cos w_{RF}t \cdot \cos(w_{LO}t + 90°)$$

$$= \frac{2}{\pi}gmv_{RF}\cos((w_{RF} - w_{LO})t + 90°)$$

In the above FORMULA 6, if phase mismatching with two θ° occurs, an output phase difference is expressed by the FORMULA 7.

$$i_{OUT1} = \frac{4}{\pi}gmv_{RF}\cos w_{RF}t \cdot \cos w_{LO}t \quad \text{FORMULA 7}$$

$$= \frac{2}{\pi}gmv_{RF}\cos(w_{RF} - w_{LO})t$$

$$i_{OUT2} = \frac{4}{\pi}gmv_{RF}\cos w_{RF}t \cdot \cos(w_{LO}t + 90° + \theta)$$

$$= \frac{2}{\pi}gmv_{RF}\cos((w_{RF} - w_{LO})t + 90° + \theta)$$

In the above FORMULA 7, if a resultant signal combined using two formulas is expressed in a phase expression method, the resultant signal is expressed by the following formula 8. As shown in FIG. 9, the resultant signal is the first and second resultant frequency signals LO1', LO2' of two LO signals.

$$LO1' = \cos w_{LO}t + \cos(w_{LO}t + 90° + \theta) \quad \text{FORMULA 8}$$

-continued $$= 1\angle 0° + 1\angle(90° + \theta) = 2\cos\left(\frac{90° + \theta}{2}\right)\angle\left(\frac{90° + \theta}{2}\right)$$

$$LO2' = \cos w_{LO}t - \cos(w_{LO}t + 90° + \theta)$$

$$= 1\angle 0° + 1\angle(90° - \theta) = 2\cos\left(\frac{\theta - 90°}{2}\right)\angle\left(\frac{\theta - 90°}{2}\right)$$

Using the above formula 8, a phase difference of the resultant signals having the 90 degree phase difference, e.g., the I resultant frequency signal LO1' and the Q resultant frequency signal LO2,' is expressed by the following formula 9.

$$\theta_{LO1'LO2'} = \frac{90° + \theta}{2} - \frac{\theta - 90°}{2} = 90° \quad \text{FORMULA 9}$$

The amplitude difference between the I resultant frequency signal LO1' and the Q resultant frequency signal LO2' is removable according to the operational characteristic of the mixer as described above. Accordingly, the output current $i_{OUT1'}$ and $i_{OUT2'}$ is expressed by the following formula 10.

$$i_{OUT1'} = \frac{4}{\pi}gmv_{RF}\cos w_{RF}t \cdot \cos w_{LO1'}t = \quad \text{FORMULA 10}$$

$$\frac{2}{\pi}gmv_{RF}\cos(w_{RF} - w_{LO1'})t + \cdots$$

$$i_{OUT2'} = \frac{4}{\pi}gmv_{RF}\cos w_{RF}t \cdot \cos w_{LO2'}t =$$

$$\frac{2}{\pi}gmv_{RF}\cos(w_{RF} - w_{LO1'} + 90°)t + \cdots$$

Here, the amplitude mis-matching may occur in the two signals. However, the amplitude mismatching does not cause further problems since the amplitude mis-matching does not affect an amplification process if the LO signals LO having a predetermined amount and amplitude are applied to the switching units according to the operational characteristic of the mixer.

FIGS. 10A to 10D are views showing phases of the first and second IF signals IF1, IF2, and the first and second LO signals LO1, LO2 in a conventional frequency conversion apparatus, and FIGS. 11A to 11D are views showing phases of the first and second IF signals IF1, IF2, and the first and second LO signals LO1, LO2 in the frequency conversion apparatus according to the embodiment of the present invention.

Figure 10A:
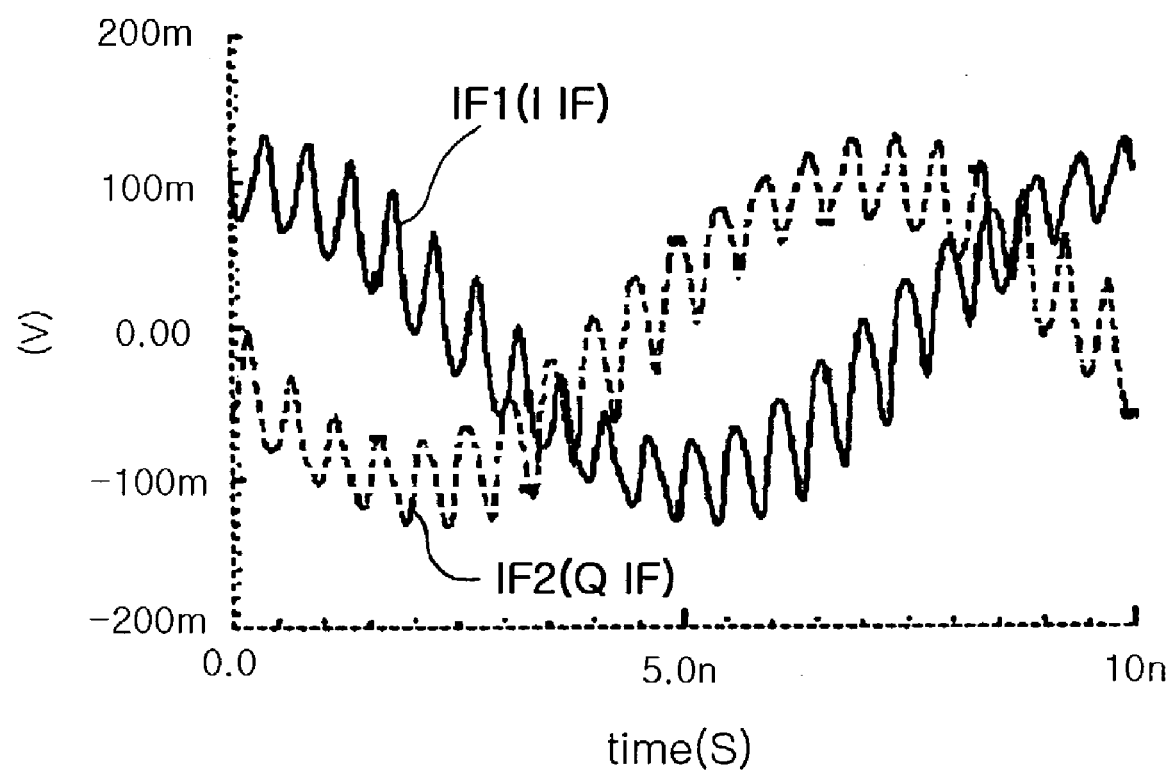
FIGS. 10A to 10D are views showing conventional oscillating signals and IF signals.
Figure 10B:
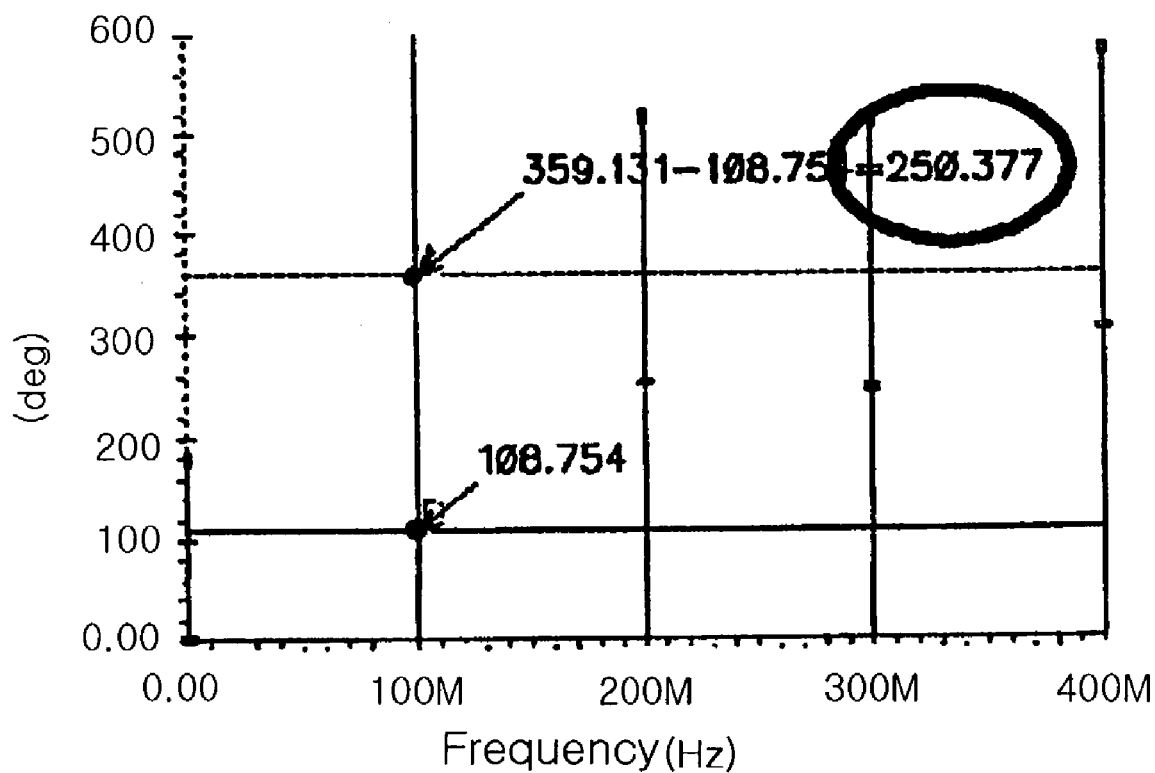
Figure 10C:
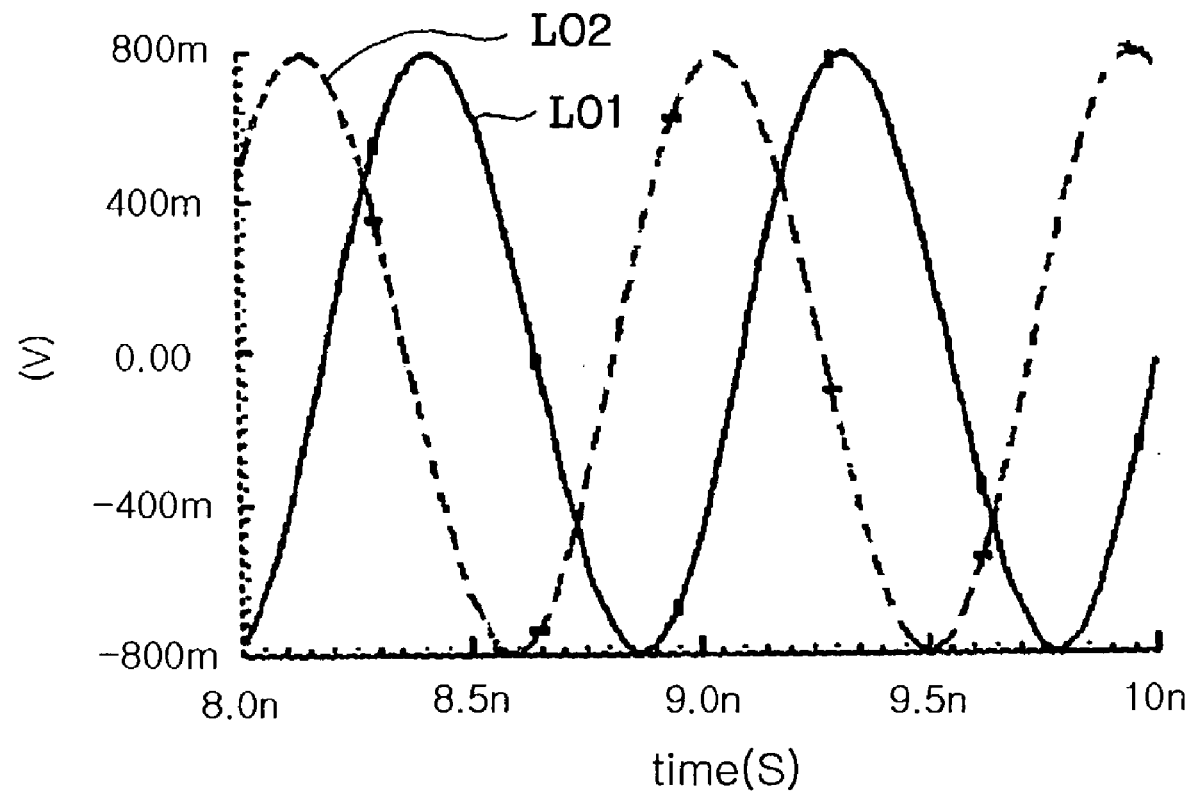
Figure 10D:
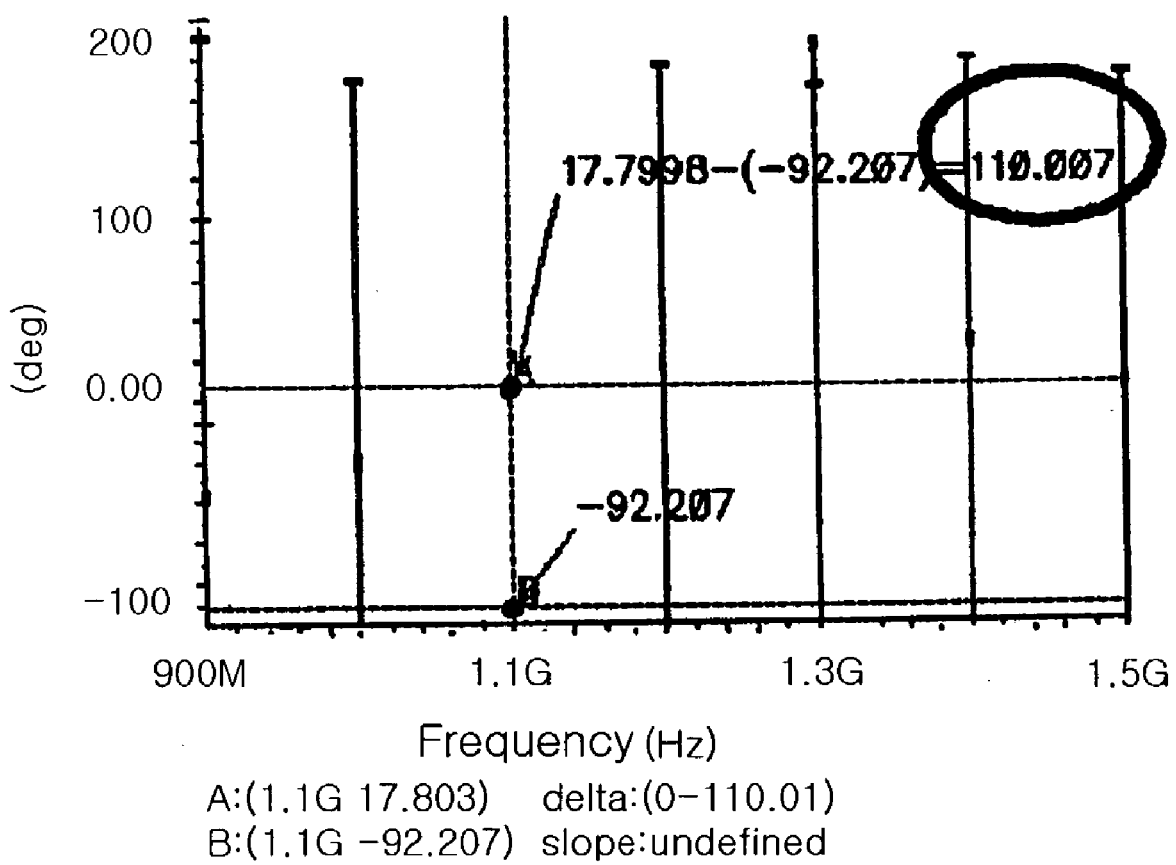
Figure 11A:
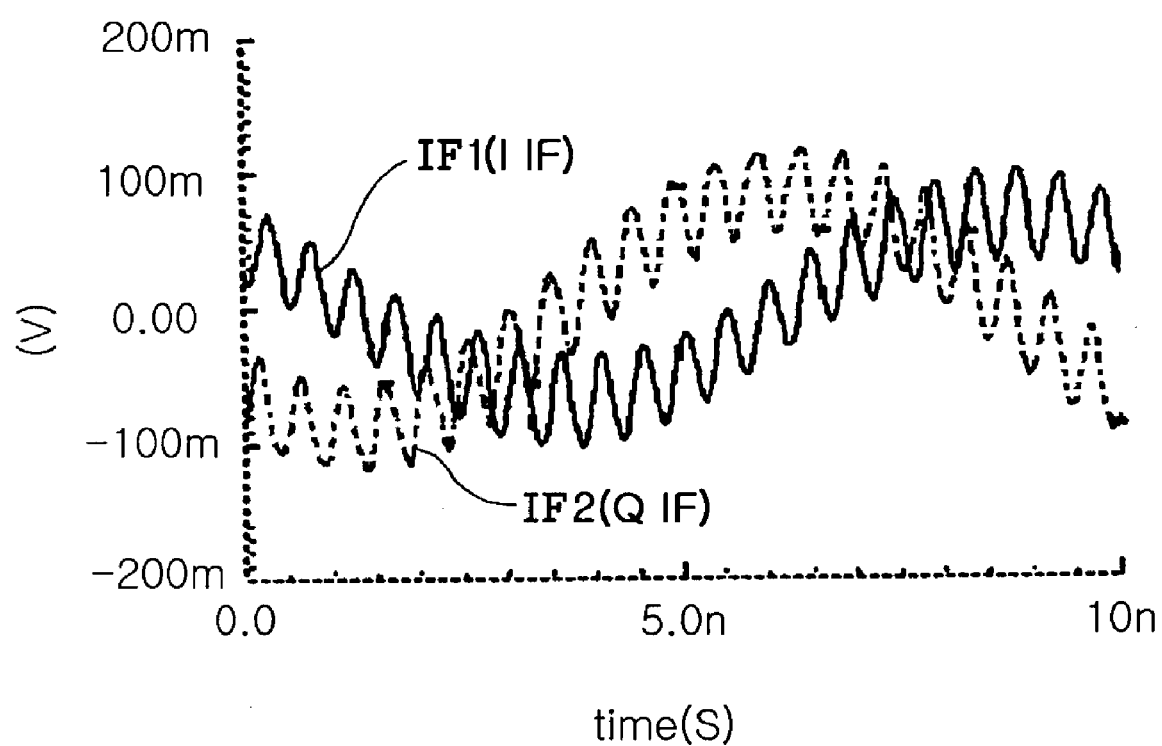
FIGS. 11A to 11D are views showing oscillating signals and IF signals generated in the frequency conversion apparatus shown in FIG. 5.
Figure 11B:
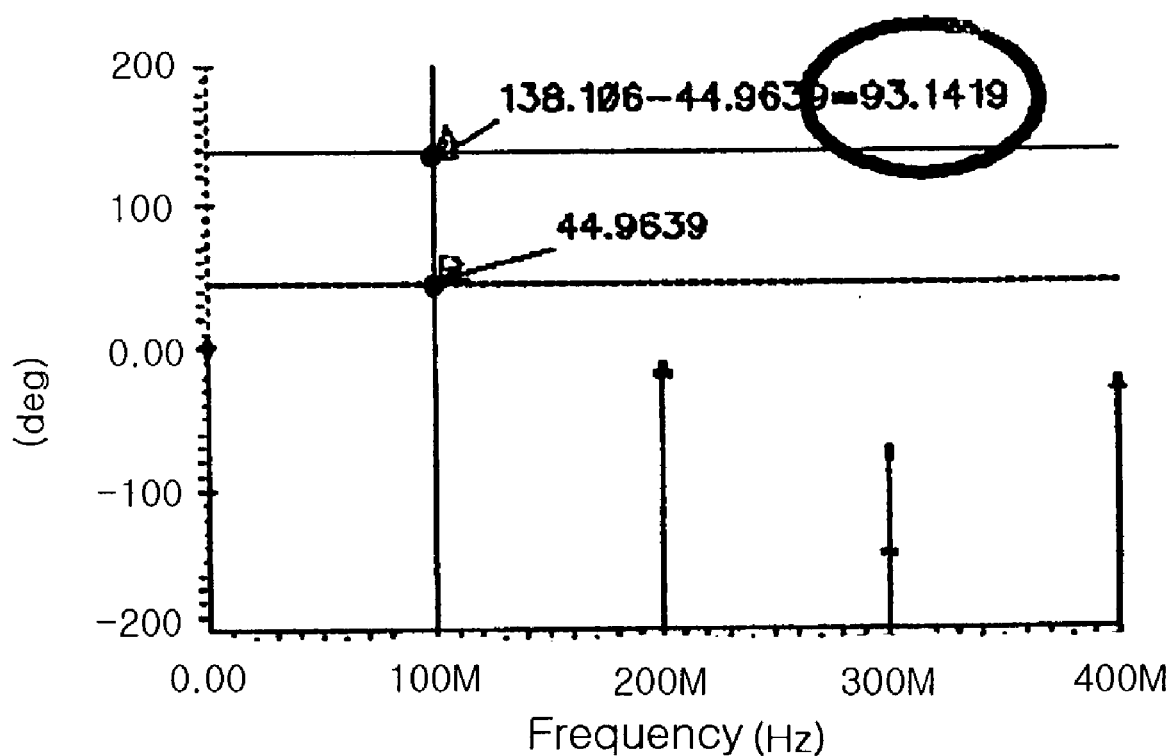
Figure 11C:
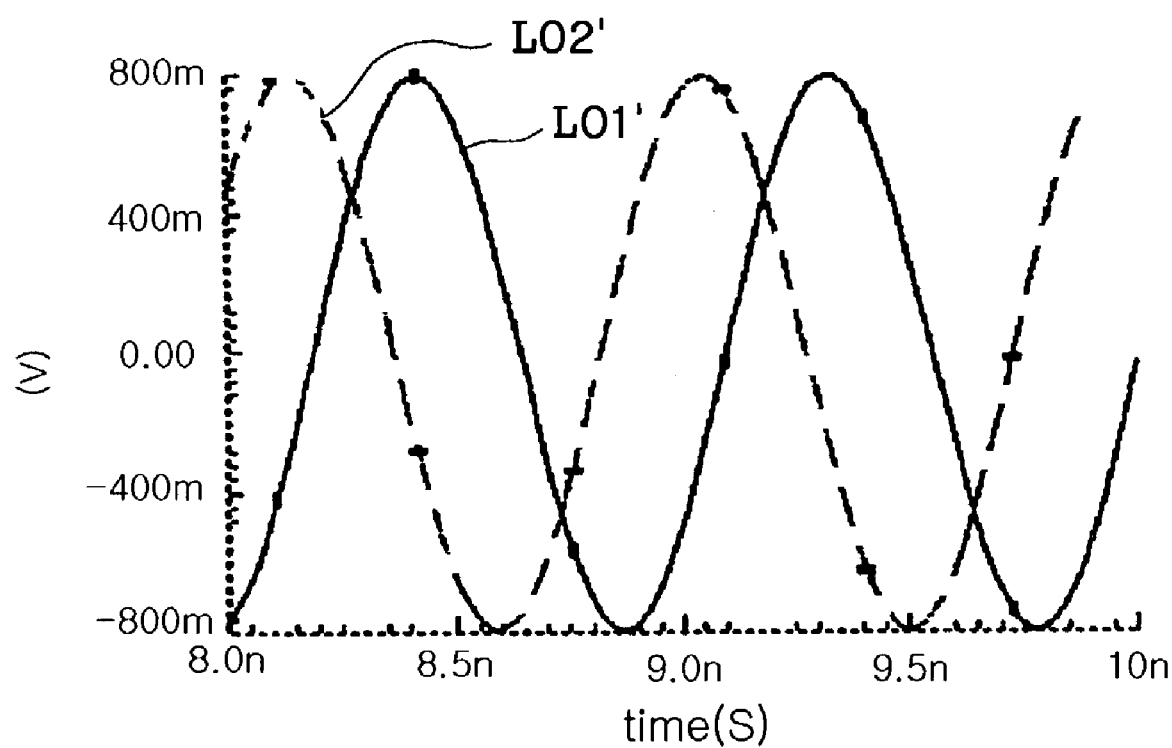
Figure 11D:
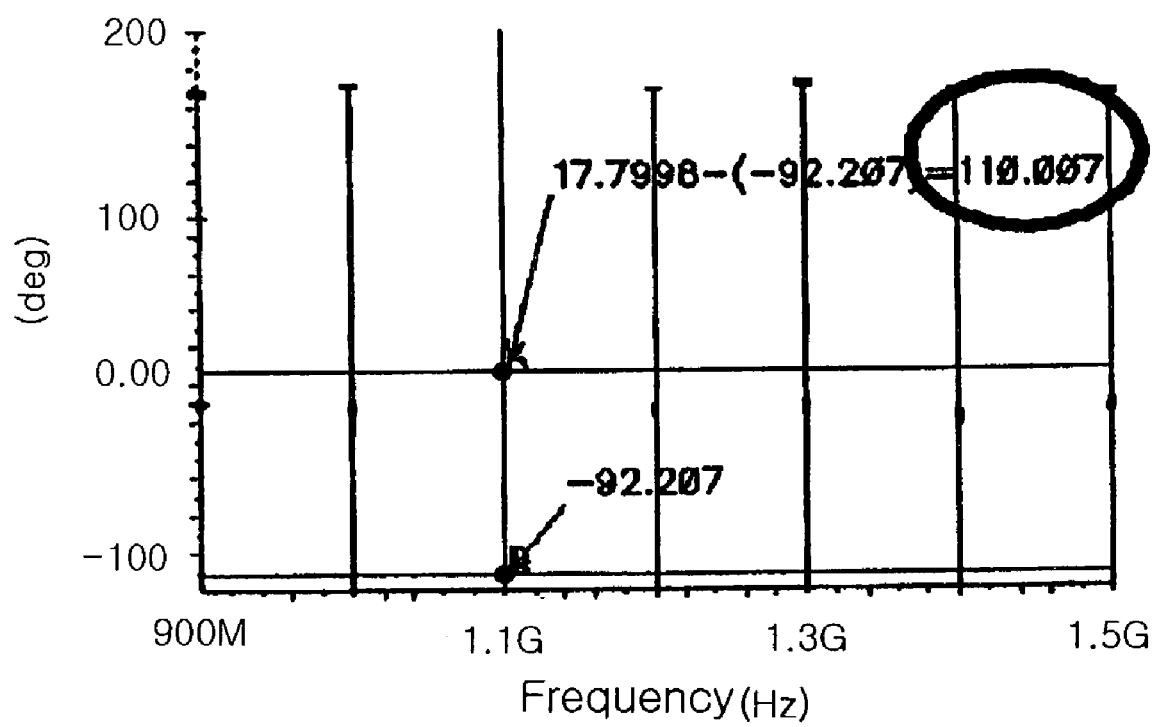

Referring to FIGS. 10A to 10D, if there is a phase difference of 110.007° of FIG. 10D in frequency waves of the first and second LO signals LO1, LO2 of FIG. 10C, the first and second IF signals of FIG. 10A have the phase difference of 250.377°. However, according to the present invention shown in FIGS. 11A to 11D, if there is a phase difference of 110.007° of FIG. 11D in frequency waves of the first and second LO signals LO1, LO2 of FIG. 11C, the first and second IF signals of FIG. 11A have the phase difference of 93.1419°.

According to this phase difference, when a LO signal having the phase difference of 20° is applied to the conventional frequency conversion apparatus and the frequency conversion apparatus according to the present invention, an improvement of the mismatching of the IF outputs s well described in FIGS. 11A to 11D compared to the mismatching of the IF outputs shown in FIGS. 10A to 10D.

In the embodiment of the present invention, a ratio of the existing switching unit and the additional switching unit is 2:1. In the conventional apparatus, the phase mismatching of the the LO signal is reflected (transmitted) on the phase mismatching of the IF signal while the phase mismatching of 20° is improved to 3.14° in the frequency conversion apparatus according to the present invention as shown in FIGS. 11A to 11D. Thus, IF signal due to the phase mismatching of the LO signal is prevented using the frequency conversion apparatus.

As described above, the frequency conversion apparatus may include the mixer generating a difference or sum frequency, the double balanced mixer, or a frequency converter. The present invention can be used in the frequency conversion apparatus as well as the receiving and transmitting apparatus processing the phase difference, such as a conversion block processing a frequency function.

According to the invention, since the phase mismatching of the two IF signals having the 90 degree phase difference is removed using the improved structure, a signal-to-noise ration is improved, and an image-rejection ratio is increased.

Although a few preferred embodiments of the present invention have been shown and described, it would be appreciated by those skilled in the art that changes may be made in this embodiment without departing from the principle and sprit of the invention, the scope of which is defined in the claims and their equivalent.

What is claimed:

1. A frequency conversion apparatus for correcting phase mismatching of first and second IF signals in response to an RF input signal transmitted through an RF input terminal, said apparatus comprising:
   a quadrature signal generator (QSG) for outputting a first oscillating frequency signal and a second oscillating frequency signal differing in phase from the first oscillating frequency signal;
   a first mixer for mixing the RF input signal with the first oscillating frequency signal and an inverted signal of the second oscillating frequency signal to generate a first IF signal; and
   a second mixer for mixing the RF signal with the second oscillating frequency signal and the first oscillating frequency signal to generate a second IF signal;
   wherein the first mixer comprises:
   a first switching unit for switching on/off the RF input signal according to the first oscillating frequency signal; and
   a second switching unit coupled to the RF input terminal parallel to the first switching unit for switching on/off the RF input signal according to the inverted signal of the second oscillating frequency signal; and
   wherein the second mixer comprises:
   a third switching unit for switching on/off the RF input signal according to the second oscillating frequency signal; and
   a fourth switching unit coupled to the RF input terminal parallel to the third switching unit for switching on/off the RF input signal according to the first oscillating frequency signal.

2. The apparatus of claim 1, wherein the QSG comprises:
   a oscillating unit for generating the first oscillating frequency signal; and
   a phase shifter for shifting the first oscillating frequency signal by 90 degrees in phase to generate the second oscillating frequency signal.

3. The apparatus of claim 1, wherein the first switching unit comprises a plurality of transistors M7, M8, M9, M10 each having a source, a drain, and a gate, and
   the sources of the transistors M7 and M9 are coupled to the sources of the transistors M8 and M10, respectively,
   the drains of the transistors M7 and M8 are coupled to the drains of the transistors M9 and M10, respectively, and
   the gates of the transistors M7 and M8 are coupled to the gates of the transistors M10 and M9, respectively.

4. The apparatus of claim 1, wherein the second switching unit comprises a plurality of transistors M3, M4, M5, M6 each having a source, a drain, and a gate, and
   the sources of the transistors M3 and M5 are coupled to the sources of the transistors M4 and M6, respectively,
   the drains of the transistors M3 and M4 are coupled to the drains of the transistors M5 and M6, respectively, and
   the gates of the transistors M3 and M4 are coupled to the gates of the transistors M6 and M5, respectively.

5. The apparatus of claim 1, wherein the third switching unit comprises a plurality of transistors M27, M28, M29, M30 each having a source, a drain, and a gate, and
   the sources of the transistors M27 and M29 are coupled to the sources of the transistors M28 and M30, respectively,
   the drains of the transistors M27 and M28 are coupled to the drains of the transistors M29 and M30, respectively, and
   the gates of the transistors M27 and M28 are coupled to the gates of the transistors M30 and M29, respectively.

6. The apparatus of claim 1, wherein the fourth switching unit comprises a plurality of transistors M23, M24, M25, M26 each having a source, a drain, and a gate, and
   the sources of the transistors M23 and M25 are coupled to the sources of the transistors M24 and M26, respectively,
   the drains of the transistors M23 and M24 are coupled to the drains of the transistors M25 and M26, respectively, and
   the gates of the transistors M23 and M24 are coupled to the gates of the transistors M26 and M25, respectively.

7. A frequency conversion apparatus, comprising:
   a frequency generator for outputting a first frequency signal and a second frequency signal differing in phase from the first frequency signal;
   a first mixer for generating a first IF signal based on (a) an RF input signal, (b) the first frequency signal, and (c) a first phase signal being an inverted signal of the second frequency signal; and
   a second mixer for generating a second IF signal differing in phase from the first IF signal based on (a) the RF input signal, (b) the second frequency signal, and (c) a second phase signal having a phase difference with respect to the second frequency signal;
   wherein each of the first and second mixers comprises:
   a first switching unit for switching on/off the RF input signal according to the first or the second frequency signal, respectively; and
   a second switching unit coupled parallel to the first switching unit for switching on/off the RF input signal according to the first or the second frequency signal, respectively;
   each of said first and second switching units comprising first, second, third and fourth transistors each having a source, a drain, and a gate;

wherein
the sources of the first and third transistors are coupled to the sources of the second and fourth transistors, respectively;
the drains of the first and second transistors are coupled to the drains of the third and fourth transistors, respectively; and
the gates of the first and second transistors are coupled to the gates of the fourth and third transistors, respectively.

8. The apparatus of claim 7, wherein the first frequency signal and the first phase signal form a first resultant signal, and the first mixer mixes the first resultant signal with the RF input signal to generate the first IF signal.

9. The apparatus of claim 8, wherein the second frequency signal and the second phase signal form a second resultant signal, and the second mixer mixes the second resultant signal with the RF input signal to generate the second IF signal.

10. The apparatus of claim 9, wherein
the first resultant signal is the sum of the first frequency signal and the first phase signal; and
the second resultant signal is the sum of the second frequency signal and the second phase signal.

11. The apparatus of claim 7, wherein the first mixer comprises:
an RF amplifier for amplifying the RF input signal and converting a voltage component of the RF input signal into a current component of the RF input signal.

12. The apparatus of claim 7, wherein the first mixer comprises:
a load unit for converting a current component of the first IF signal into a voltage component of the first IF signal.

13. The apparatus of claim 7, wherein the second mixer comprises:
an RF amplifier for amplifying the RF input signal and converting a voltage component of the RF input signal into a current component of the RF input signal.

14. The apparatus of claim 7, wherein the second mixer comprises:
a load unit for converting a current component of the second IF signal into a voltage component of the second IF signal.

15. The apparatus of claim 7, wherein the second phase signal is the first frequency signal.

16. A mixer for mixing an RF input signal transmitted through an input terminal with an oscillating frequency signal, said mixer comprising:
a first switching unit for switching on/off the RF input signal according to a first oscillating frequency signal to generate a first IF signal; and
a second switching unit coupled to the input terminal and parallel to the first switching unit for switching on/off the RF input signal according to an inverted signal of a second oscillating signal to generate a second IF signal having a predetermined phase angle with the first IF signal;
wherein each of said first and second switching units comprises first, second, third and fourth transistors each having a source, a drain, and a gate;
wherein
the sources of the first and third transistors are coupled to the sources of the second and fourth transistors, respectively;
the drains of the first and second transistors are coupled to the drains of the third and fourth transistors, respectively; and
the gates of the first and second transistors are coupled to the gates of the fourth and third transistors, respectively.

* * * * *